United States Patent [19]
Holbrooks

[11] Patent Number: 6,167,322
[45] Date of Patent: Dec. 26, 2000

[54] INTELLIGENT WAFER HANDLING SYSTEM AND METHOD

[76] Inventor: Orville Ray Holbrooks, 511 Gruman Dr., Carson City, Nev. 89706-0436

[21] Appl. No.: 09/245,010

[22] Filed: Feb. 4, 1999

Related U.S. Application Data

[63] Continuation-in-part of application No. 09/113,857, Jul. 10, 1998, abandoned.

[51] Int. Cl.[7] .................................................... G06F 19/00
[52] U.S. Cl. ................ 700/112; 318/568.16; 294/103.1; 414/941
[58] Field of Search .............................. 700/56, 59, 121, 700/213, 260, 112; 318/568.16, 568.21; 901/34, 38; 414/783, 941, 935; 294/88, 106, 104, 103.1

[56] References Cited

U.S. PATENT DOCUMENTS

| | | |
|---|---|---|
| 4,351,553 | 9/1982 | Rovetta et al. ........................ 294/106 |
| 4,410,209 | 10/1983 | Trapani ..................... 294/34 |
| 4,417,757 | 11/1983 | Morrison ................... 294/26 |
| 4,653,793 | 3/1987 | Guinot et al. .......................... 294/86.4 |
| 4,735,452 | 4/1988 | Nemoto ................ 294/119.1 |
| 4,808,898 | 2/1989 | Pearson ............... 318/568.21 |
| 4,813,732 | 3/1989 | Klem .................. 294/103.1 |
| 4,944,650 | 7/1990 | Matsumoto ............................ 414/757 |
| 4,957,320 | 9/1990 | Ulrich ..................... 294/106 |
| 4,971,512 | 11/1990 | Lee et al. ............. 414/744.8 |
| 5,022,695 | 6/1991 | Ayers ....................... 294/88 |
| 5,061,144 | 10/1991 | Akimoto et al. ................... 414/222.02 |
| 5,105,147 | 4/1992 | Karasikov et al. ..................... 324/537 |
| 5,108,140 | 4/1992 | Bartholet ............... 294/106 |
| 5,133,635 | 7/1992 | Malin et al. ............. 414/744.8 |
| 5,172,951 | 12/1992 | Jacobsen et al. ........................ 294/104 |
| 5,188,501 | 2/1993 | Tomita et al. ............. 414/416 |
| 5,280,981 | 1/1994 | Schulz ................... 294/106 |
| 5,378,033 | 1/1995 | Guo et al. ............... 294/116 |
| 5,425,133 | 6/1995 | Yasuhara et al. ..................... 700/249 |
| 5,501,498 | 3/1996 | Ulrich ..................... 294/106 |
| 5,504,345 | 4/1996 | Bartunek et al. ................... 250/559.4 |
| 5,570,920 | 11/1996 | Crisman et al. ........................ 294/111 |
| 5,700,046 | 12/1997 | Van Doren et al. ................. 294/119.1 |
| 5,711,647 | 1/1998 | Slocum ................ 414/751.1 |
| 5,810,935 | 9/1998 | Lee et al. ................. 118/728 |
| 5,825,913 | 10/1998 | Rostami et al. ...................... 382/151 |
| 5,829,811 | 11/1998 | Skinner, II ................ 294/88 |

(List continued on next page.)

OTHER PUBLICATIONS

Borovac et al., A new type of force sensor for contact tasks, IEEE, 1791–1796, 1994.

Borovac et al., Soft sensored grippers in assembly process, IEEE, 1283–1288, 1992.

Wafer Gripping Device, WO9815971, *Abstract*.

*Primary Examiner*—William Grant
*Assistant Examiner*—Chad Rapp
*Attorney, Agent, or Firm*—Koppel & Jacobs; Michael J. Ram

[57] ABSTRACT

A system for handling stiff but flexible discs, particularly semiconductor wafers, is capable of allowing processing on both sides of a wafer. Optical beams are employed to detect a wafer's edge, ascertain a wafer position and determine the size of the wafer. A wafer hand assembly member is slipped under a wafer, or between parallel stacked but spaced wafers, and one or more fingers are rotated 90° to a position perpendicular to the plane of the stiff hand assembly member. The hand assembly also has one or more posts positioned perpendicular to the surface of the hand assembly. The finger(s) and post(s) constitute three upright projections forming the corners of a triangle with the wafer to be grasped there between. A translator solenoid, through an arm, controls the lateral location of one finger or post moving that finger or post toward the other two stationary fingers or post(s) of the translator solenoid, grasping the wafer with controlled traction force between the fixed posts and the moveable finger. The traction force is controlled by the amount of driving energy fed to the translator solenoid. Likewise, methods using the apparatus of the system of the present invention are taught.

15 Claims, 9 Drawing Sheets

U.S. PATENT DOCUMENTS

| | | | |
|---|---|---|---|
| 5,914,918 | 6/1999 | Lee et al. | 369/34 |
| 5,931,518 | 8/1999 | Pirker | 294/119.1 |
| 5,938,902 | 8/1999 | Nguyen et al. | 204/298.15 |
| 5,988,971 | 11/1999 | Fossey et al. | 414/416 |
| 5,990,650 | 11/1999 | Brock | 318/640 |
| 6,002,109 | 12/1999 | Johnsgard et al. | 214/390 |
| 6,092,971 | 7/2000 | Balg et al. | 414/416 |

INTELLIGENT WAFER HANDLING SYSTEM AND METHOD

This is a continuation in part of U.S. patent application Ser. No. 09/113,857 filed Jul. 10, 1998 now abandoned.

BACKGROUND OF THE INVENTION

1. Area of the Art

The present application relates to systems for the handling and local transport of disc shaped flat sheets of stiff but flexible materials such as integrated circuit wafers and the like materials. Particularly, the present invention relates to an intelligent integrated circuit wafer location and handling system and a method for selectively positioning and processing both sides of a subject wafer.

2. Description of the Prior Art

Semiconductor wafers are produced by complex multi-step processes. Sophisticated integrated circuit type electronic chips are derived from wafers during processes involving often greater than 100 steps. Many of these steps require extremely accurate positioning of the chips because the submicron range technologies used in manufacturing the chips are both error and inspection intensive. Also, the wafers before processing are extremely expensive, and become even more valuable after processing. There is therefore a strong need for heightened control of processing and handling methods for the involved wafers.

It follows that the high production rates required for production of integrated circuits necessitate that the wafers upon which individual circuits are located be processed rapidly and in batches. Typical wafers being processed have diameters ranging from about 4 inches to about 12 inches. Such wafers are generally housed for processing in cassettes, or caddies in closely stacked vertical arrangements.

Processing generally entails separate removal of each subject wafer from its housing cassette and loading of the same into the processing equipment utilized, followed by return of the processed wafer to a cassette or carrier. The receiving cassette may be different than the first cassette, and the fragile nature of the wafers, generally silicon, provides further constraints. Removal, processing and repositioning of these varying sized wafers has created a longstanding need for more efficient apparatus and methods for processing them. Further, because the wafers are thin as well as formed from brittle materials, the pressure exerted on the wafers by the handling device can be critical and the gripping pressure must be carefully controlled to minimize bending, cracking or chipping of the costly wafers while still assuring a firm grip on the wafer to avoid dropping it during handling.

Patented Apr. 14, 1992, the WAFER INSPECTION SYSTEM of U.S. Pat. No. 5,105,147 ("Karasikov" et al.) is typical of the state of at least one aspect of the existing art. The disclosed system is for the semiautomatic inspection of printed circuits on silicon wafers. Included in the Karasikov patent are the combination of a floating table, and a robotic arm optical inspection device which includes a sophisticated optoscanner for the alignment and positioning of a wafer.

Karasikov removes involved wafers by applying a vacuum to a narrow zone at the circumference of a wafer. The mechanism of the Karasikov patent highlights problems which result in many of the processing errors ameliorated by the teachings of the present invention.

Likewise, U.S. Pat. No. 5,504,345 ("Bartunek" et al.) which issued Apr. 2, 1996, disclosed a dual beam sensor and edge detection system and method. Two light sources, or solid state lasers, are used to detect the edges of the involved wafers. The Bartunek patent essentially shows that lasers may be used for the detection of, for example, the reflective surface of a wafer or optical disc.

Other known systems for wafer handling similarly either address improvements in locating wafers or quasi-automated means for handling wafers. It would be highly advantageous to have the capability for concurrently improving the performance of both of these functions within a single system. Capitalizing upon the use of lasers without the drawbacks of vacuum-based technology would solve many longstanding needs.

By way of example, current technology often uses a vacuum chuck mounted on a robotic arm to remove or replace individual wafers in the cassettes. Since the position of each cassette and each wafer within the cassettes is unique, the location of each disk within the three ordinal planes ("X, Y, and Z") relative to some reference has to be entered into the software driving system controlling the robotics that handle the wafers.

Existing methodology requires mechanical measurement of each location followed by the data being manually entered into the software being utilized. This a time consuming process additionally constrained by the high likelihood of human error. Sufficient differences exist among known cassettes and cassette holders, that a calibration of every cassette to be employed is generally required.

Further, these constraints are complicated by the fact that, for example, in semi-portable processing systems, relocation of any part of the system requires new calibration.

Conventional vacuum chucks further induce harmful artifacts of the processing steps and these artifacts can result in lower industrial efficacy. Any warpage in the employed vacuum chuck may cause malfunctioning because of air leaks. Since the vacuum chucks must be thin and contain air passages, they are difficult and expensive to build. Further, since the wafer is held by the surface, the wafer is prone to slip under the high acceleration rates necessary in high speed processing. Any misalignment of the disk with the arm can cause the system to crash. Contamination of the surface by the arm itself occurs with alarming frequency.

Likewise, a clear need exists for a way to process both sides of a semiconductor wafer. Among the prior art, various attempts at solutions to related problems, and methods for handling wafers for processing are illustrative of the paucity of patents actually addressing the above enumerated constraints. The state of the art clearly shows a need for improvement, such as taught by the present invention.

Another method of lifting wafers is the use of mechanical grippers, U.S. Pat. No. 5,570,920 ("Crisman" et al.) issued Nov. 5, 1996, utilizes a DC motor to drive a robotic finger. Unlike the teachings of the present invention, strain gauges 171, 173, 175 on the inner surfaces of the fingers are used to sense gripping pressure and, once activated, stop the motor.

By way of further example, U.S. Pat. No. 5,435,133, which issued Jun. 13, 1995 ("Yasuhara" et al.) utilizes servo motors which drive robotic fingers based on positioning signals. However, no sensors to indicate or control grasping force were found. Likewise, the complex attaching/detaching portion of the hand portion was the focus of Yasuhara's disclosure, differentiating this patent from the teachings of the present invention.

Additionally, U.S. Pat. No. 5,378,033 ("Guo" et al.) which issued Jan. 3, 1995, utilizes a single drive mechanism for all of the involved mechanical fingers so that they apply a uniform force on the object grasped. The Guo patent teaches a purely mechanical robotic or prosthetic hand. However, the method of controlling the drive mechanism was not apparent, differentiating the Guo patent from the teachings of the present invention.

U.S. Pat. No. 5,280,981 ("Schulz") issued Jan. 25, 1994 uses a load responsive two-speed drive assembly and a slip clutch. See Col 9, line 63–col 10, line 28. Notably, the digit actuation mechanism of the Schulz patent contemplates neither using solenoids nor current generation means wherein a force directly proportional to current is used.

U.S. Pat. No. 5,188,501 ("Tomita" et al.) issued Feb. 23, 1992, was directed to a wafer transfer system which uses a set of claws which pivot under a wafer to serve as a lifting platform for the wafer. The Tomita patent is thus different from the teachings of the present invention because it works by creating a lifting force which cradles the wafer rather than applying a grasping force.

Issued Dec. 22, 1992, "Jacobsen"'s U.S. Pat. No. 5,172,951 does not appear to disclose a tension sensing or controlling technique. This ROBOTIC GRASPING APPARATUS operates with three degree of freedom, yet does not disclose wafer-friendly usages such as those which are an object of the present invention.

U.S. Pat. No. 5,108,140 ("Bartholet") issued April 4, 1992, includes a palm plate and grippers having tactile or other sensors on its upper surface to detect the position of the payload or to provide input to the control mechanism (Col 5. lines 20–37). A parallel vise like grip is generated but no means of detecting or controlling the gripping force appears to be given.

Likewise, "Ulrich"'s U.S. Pat. No. 5,501,49 (issued Mar. 26, 1996) and U.S. Pat. No. 4,957,320 (issued Sep. 18 1990) each use tactile sensors 200, 210 located on the palmar surfaces of the fingers and the palm.

U.S. Pat. No. 4,354,553 ("Rovetta" et al.) issued Sep. 28, 1982 shows a three finger grasping system where the force applied by the fingers is supplied by traction cables 42, 43, 44 along the inner surface of the fingers such that tension applied to the fingers causes the fingers to pivot inward, tightening the grasp on the held object. Sensors 84, 85, 86, shown in FIG. 6 of the Rovetta patent, attached to the tension cables sense the traction force applied thereto, differentiating the Rovetta patent from the teachings of the present invention.

Finally, U.S. Pat. No. 4,653,793 ("Guinot") incorporates strain gauges 26, 28 on the fingers.

Accordingly, since nothing among the prior art has adequately addressed the longstanding needs ameliorated by the present invention, an intelligent integrated circuit wafer handling system is offered to meet these needs.

OBJECTS AND SUMMARY OF THE INVENTION

Accordingly, it is an objective of the present invention to provide a system which overcomes the drawbacks of the prior art for chip holding apparatus and techniques.

Figure 8:
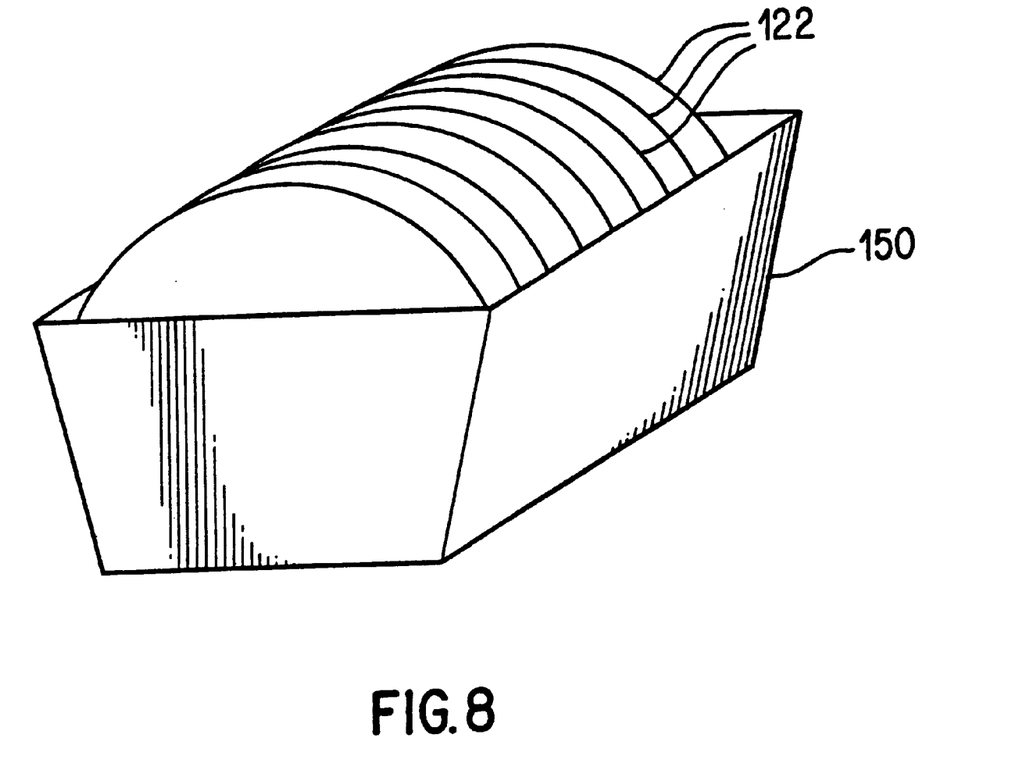
FIG. 8 is a schematic perspective top plan view of a series of wafers in a carrier.

Briefly stated, there is provided a system for handling stiff but flexible discs, particularly semiconductor wafers, which is capable of allowing processing on both sides of a wafer. Optical beams are employed to detect a wafer's edge and ascertain a wafer position. Grasping by a unique robotic wafer hand assembly plugged into other robotic systems for positioning is taught. A stiff wafer hand assembly member has one or more actuating rods disposed either centrally or spaced apart along the length of the member. As the wafer hand assembly member is slipped under a wafer, or between parallel stacked, spaced wafers, one or more rotating fingers, which begin in a released position are rotated 90 degrees and spaced from the member edge. A translator solenoid, acting through an arm, applies lateral movement to the finger or a separate post to grasp the wafer. A rotator solenoid 109 turns the finger 90°. This combination presents a thin profile so the wafer hand assembly member can be inserted under a top wafer between stacked, spaced wafers in a tray as shown in FIG. 8, or rotated 180° to pick up the wafer residing in a processing device. Once positioned under, over or alongside a wafer, the finger is rotated to the vertical position by the rotator solenoid. Depending on the embodiment, the finger is pulled or the post is pushed in by the translator solenoid, grasping the wafer with controlled traction force between the post(s) and the movable finger(s). Methods for use of the apparatus of the system of the present invention are also taught.

Figure 9:
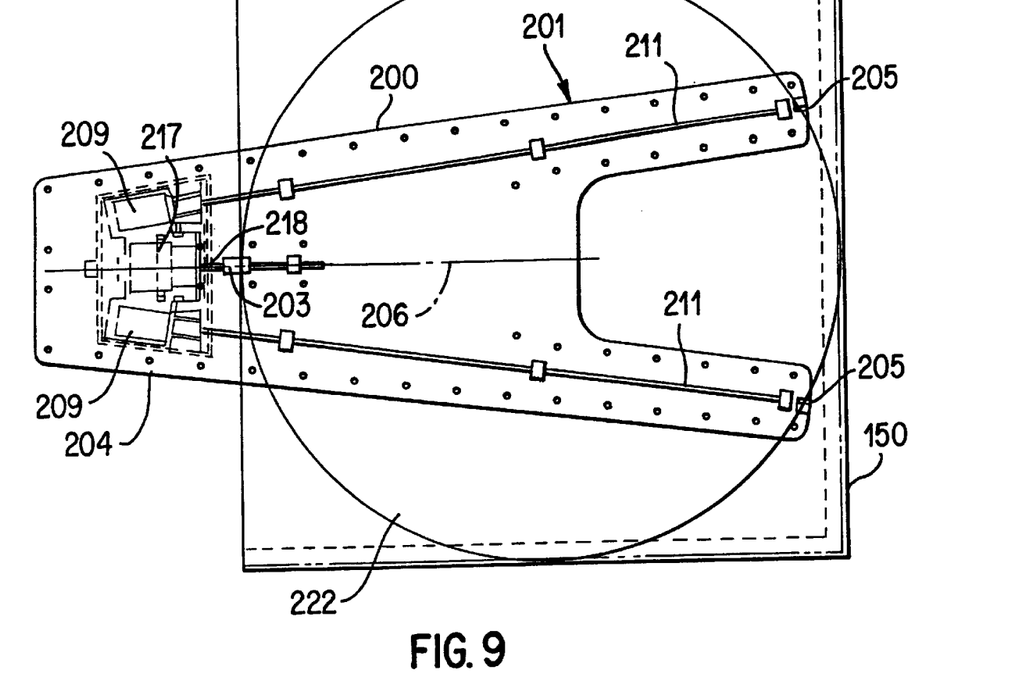
FIG. 9 is a top view of a further embodiment with two rotating fingers and a single moveable post.
Figure 10:
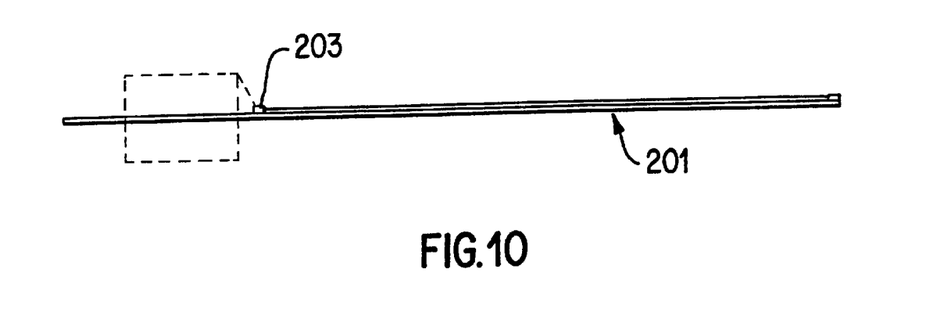
FIG. 10 is a side view of the embodiment of FIG. 9.
Figure 11:
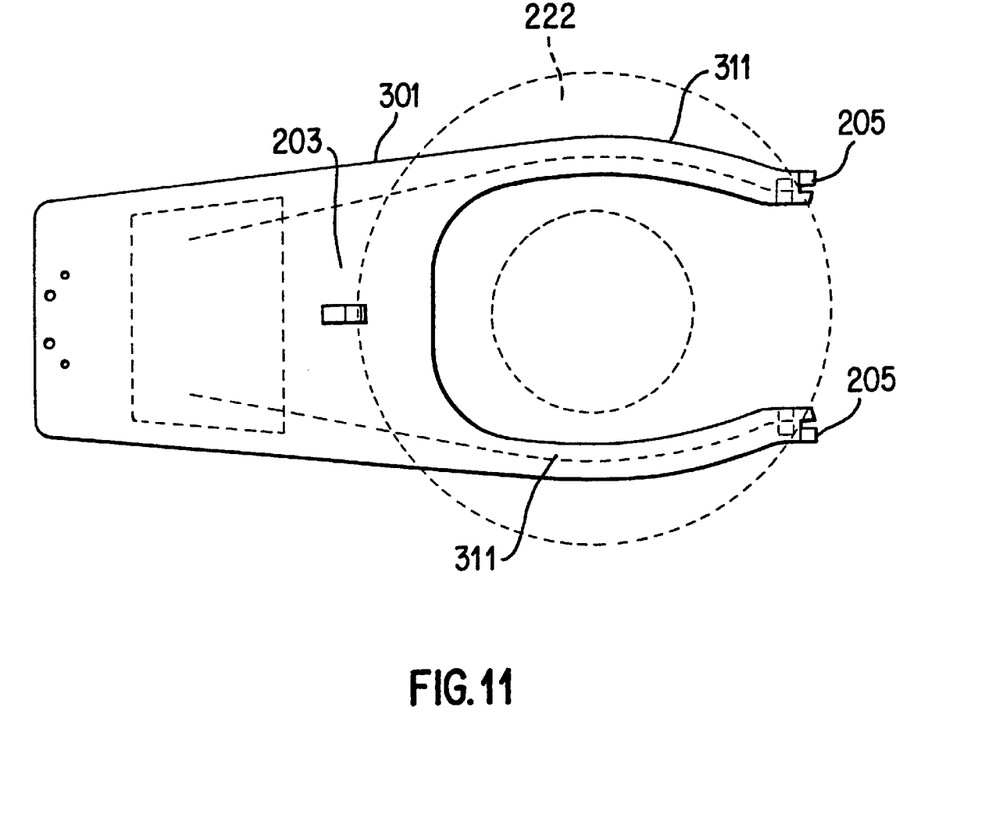
FIG. 11 is a top view of a modification of the embodiment of FIG. 9 with flexible, rotational actuating rods.

As shown schematically in FIG. 8, the wafers are usually carried in a tray. In various different embodiments of the tray 150, the circular wafer may contact and rest on the tray sides and/or the tray bottom. More specifically, the lower most point of the wafer as it rests in the tray 150 may be in contact with a point in the center of the tray bottom (See FIG. 9). In an alternative tray design the wafer may only contact the sides of the tray thus spacing the bottom of the wafer from the tray bottom. As a further alterative, the tray bottom may have an opening along the length thereof. If the wafer is sufficiently spaced from the bottom of the tray 150, or there is an open space in the tray bottom the wafer handling system of FIGS. 1–8, having a centrally located rotatable finger, can be used. However, if the wafer contacts the bottom of the tray 150 along the tray center line then the rotatable fingers must be spaced from the center of the front edge 124 of the handling system as shown in the embodiment of FIGS. 9–11 and more particularly in FIG. 9.

According to a feature of the present invention, there is provided a system for handling wafers and the like substrate means, which comprises, in combination, a hand assembly, a means for grasping, transporting and returning said substrate means to be handled, and at least a control means for programming and implementing a desired sequence of operations. This system may also include a separate or integral optical means for detecting a local position and orientation of a substrate means to be handled.

The system may further include optical detection means in combination with computer based identification calibration and control means for determining the size or identity of the wafers and subsequent control of the movement and positioning of the moving finger and the tension placed on the wafer grasped by the system.

According to another feature of the present invention there is provided a method for handling wafers, and related compact planar devices without damaging their surface integrity, the method comprising the steps of:

a) providing a robotic wafer hand assembly equipped with at least one or more posts, which may be fixed or moveable, a rotating finger and optical sensing means, which robotic wafer hand assembly is attached to other robotic systems for positioning;

b) reading a plurality of data regarding the relative position and orientation of a plurality of wafers;

c) grasping a wafer by use of an actuating rod disposed in a central portion of said robotic wafer;

d) locking the wafer between the post(s) and the finger(s);

e) transporting the wafer to a desired location, processing the wafer;

f) releasing said wafer into a desired location, and g) repeating each of said steps for a subsequent wafer.

BRIEF DESCRIPTION OF THE FIGURES

The above-mentioned and other features of this invention and the manner of obtaining them will become more apparent, and will be best understood by reference to the following description, taken in conjunction with the accompanying drawings. These drawings depict only a typical embodiment of the invention and do not therefore limit its scope. They serve to add specificity and detail, in which.

The invention is defined in its fullest scope in the appended claims and is described below in its preferred embodiments.

DETAILED DESCRIPTION OF THE INVENTION

Disclosed is a system to handle flat, stiff but flexible discs, such as semiconductor wafers, the system being capable of allowing processing on both sides of wafer being handled. The system may employ optical beams to detect the wafer edge and consequently the wafer position. The system also incorporates means to control the pressure applied by the grasping means. A unique robotics hand then grasps the wafer in such a manner as to allow rotation through 360 degrees around the long axis of the hand or angular movement up or down much the same as flexing the natural wrist, or rotating the hand or arm. The hand design is such that it plugs into or otherwise attaches to positioning robotics. This permits quick interchange of configurations (size for example) and minimum downtime for maintenance.

The system likewise employs state-of-the-art robotics to control all positioning functions. This includes computer technology as well as specialized electronics. Software driving the system is necessarily unique to the required application, but is structured as compatible with existing commercially available software. Data output may include any or all of the common technologies now in use, or those within the technical knowledge of an artisan.

As discussed in detail below, at least five major subsystems may be within or used in conjunction with preferred embodiments of the present invention:

1) a robotics 'hand' to grasp the wafers and allow them to be rotated through 360 degrees for processing on both sides;

2) an optical reading system that accurately locates the position of each wafer, enabling the 'hand' to access the wafer without breakage;

3) a data processing and control system to control the hand and associated mechanics and to act on the data supplied by the optical subsystem;

4) control means to select the appropriate pressure or tension applied to the wafer; and 5) software and firmware to drive the system.

In addition to being used for wafer processing, the system of the present invention can be used in other applications. This would include, but not be limited to, magnetic disk processing, CD ROM processing, and in general any process that could utilize a robotics hand with these characteristics. The ability to uniquely locate a part makes the proposed system an exceptional and unique candidate for inventory, parts tracking, and all other manufacturing processes where it is required, or beneficial, to keep track of the number and location of assemblies.

A particular example of a use of the present invention is for placing silicone wafers into various cassettes or caddies for different processing steps. These exemplary embodiments are offered hereafter as demonstrative of examples of the working models of the present invention and is not meant to be limiting of the claimed subject matter of the present invention. Accordingly, while the embodiments are representative of the subject matter set forth in the claims appended hereto, they are not meant to limit the scope of the invention.

Figure 1:
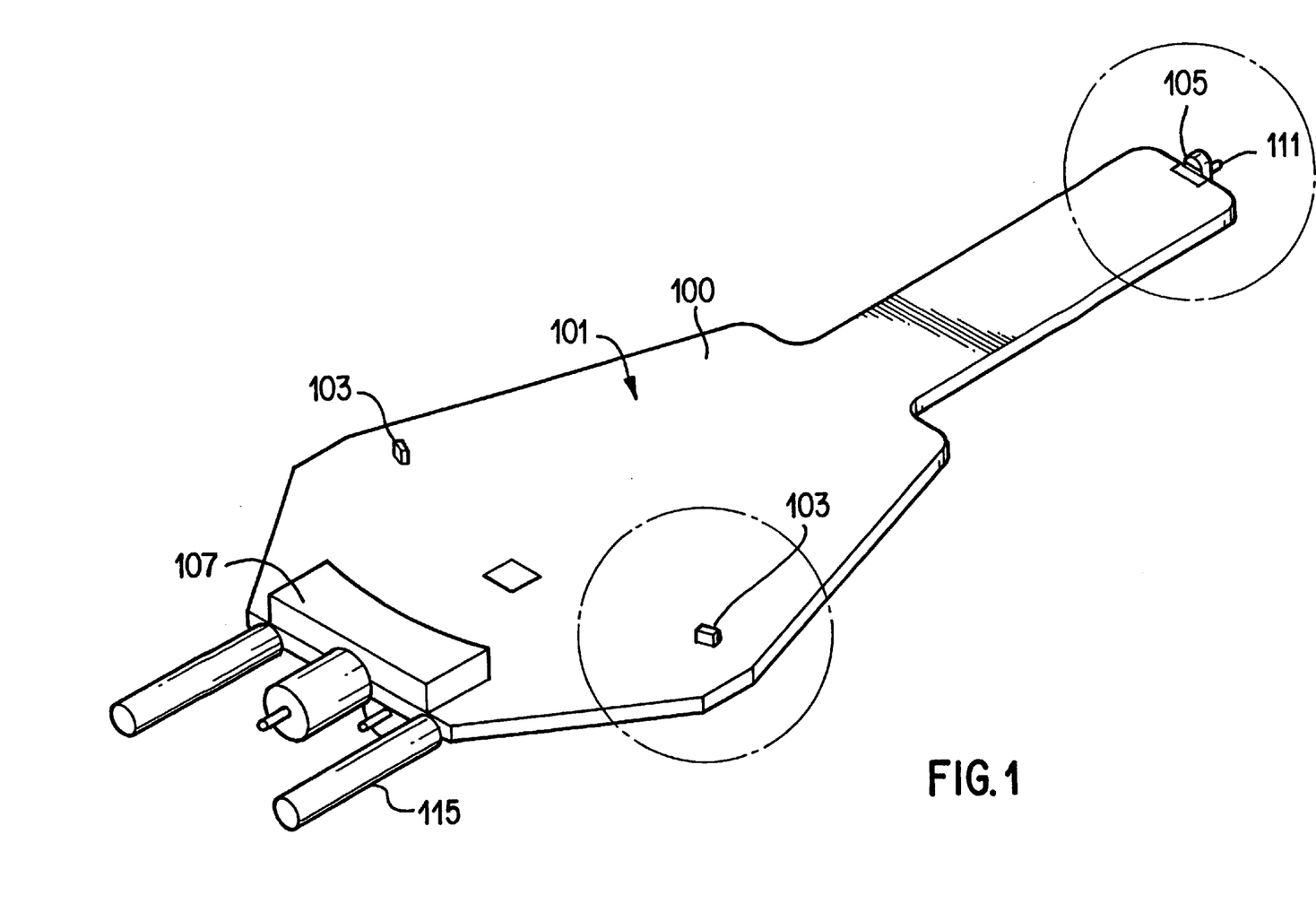
FIG. 1 is a perspective top plan view of a first version of a robotics wafer hand assembly according to an embodiment of the present invention.

Referring now to FIG. 1, a robotics wafer hand assembly 101 includes a paddle 100, which is made up of 2 thin stiff members secured together, for ease of manufacturing, to form a single thin stiff member, made from a material appropriate for the application, with two fixed pressure posts 103 located thereon, and a rotating finger 105 at the end thereof located in opposition to the posts 103. Mounted to the wafer hand assembly 101 are the actuating mechanisms to rotate the finger 105 and locating/positioning optics mount 107.

Design of the wafer hand assembly 101 is such that it can plug into or be otherwise attached to a robotics arm (not shown) at a first end proximate to optics mount 107 using hand mount 115, or other suitable mounting or connecting means common in the industry. Also included would be electrical and data coupling means to attach the hand to control systems. This permits quick removal for repair. Also, various configurations of the wafer hand assembly 101; e.g. different sizes, can be interchanged in minimal time. Such combination with known systems and interchanging would be known to those working with such systems; therefore, further detail regarding the same has been omitted.

Once the desired optical readings are taken and the programmed sequence of operations to be performed ascertained, lifting hand 101 grabs a wafer at three points of the disk. Two of the points 103 are in fixed locations spaced apart on a circumferential line with the radius equal to approximately that of the wafer. At each point is a small post 103 with small groove 126 to hold the edge of the wafer. The third lifting point is the moveable finger 105 that supplies the clinching action for the lift.

Wafer hand assembly 101 moves to the wafer with the finger 105 retracted. In the retracted position, the finger 105 rotates 90 degrees (it now has the same orientation as the other posts), and is drawn back toward the other two holding points 103. This clinches the wafer between the posts 103 and the finger 105.

Rotation of the finger can be accomplished electromechanically or merely mechanically by a cam. Cam operation simplifies the electronics, but is subject to wear, lubrication, and contamination factors. In addition, more machining may be required. It is also contemplated that the finger 105 in its retracted position may point along the axis of, and in the plane of the hand 101, rather than perpendicular to the axis as shown on FIG. 2a.

Figure 2A:
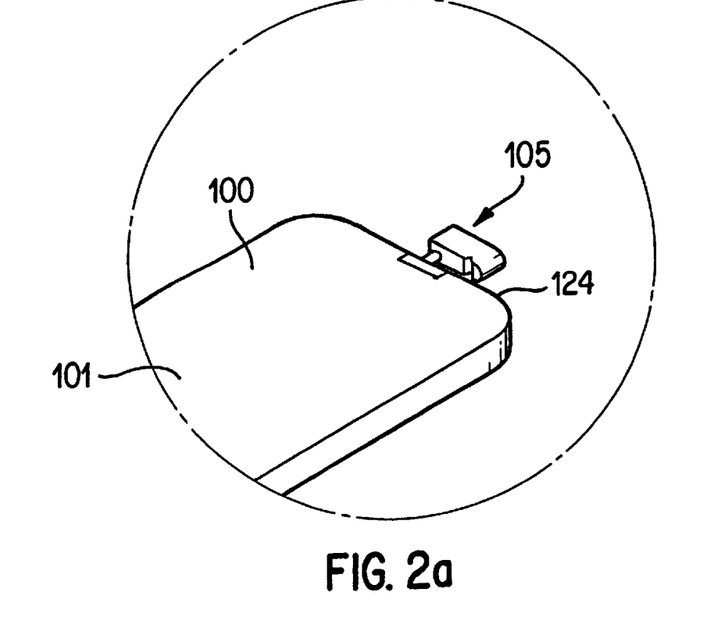
FIGS. 2a, b, and c are detailed views of enlarged portions of FIG. 1, showing the rotating finger in three different positions.
Figure 2B:
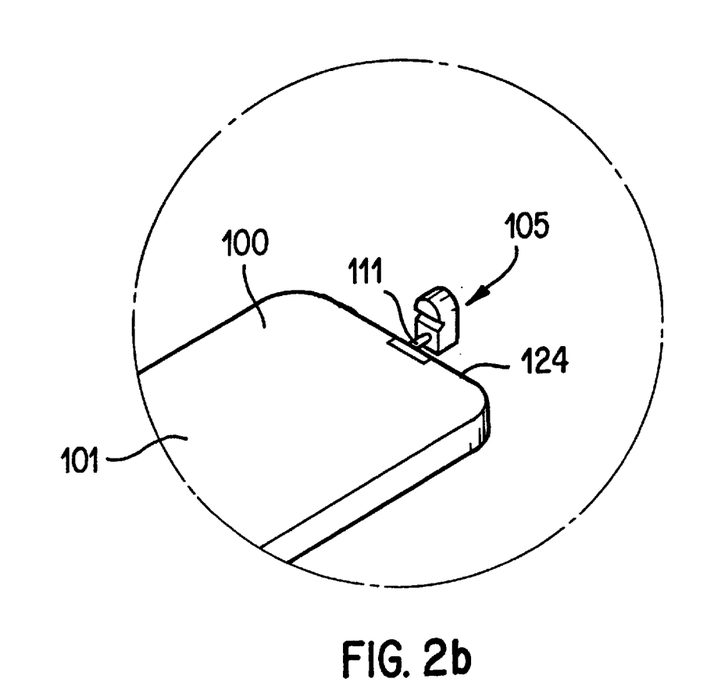
Figure 2C:
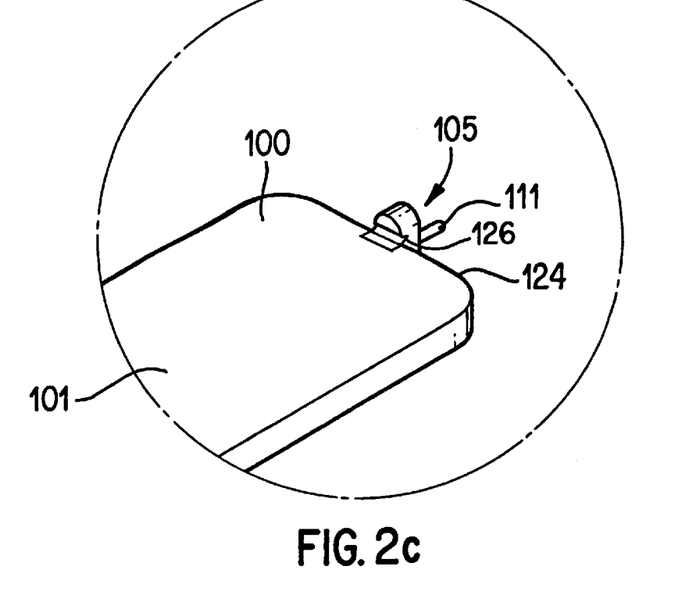
Figure 3:
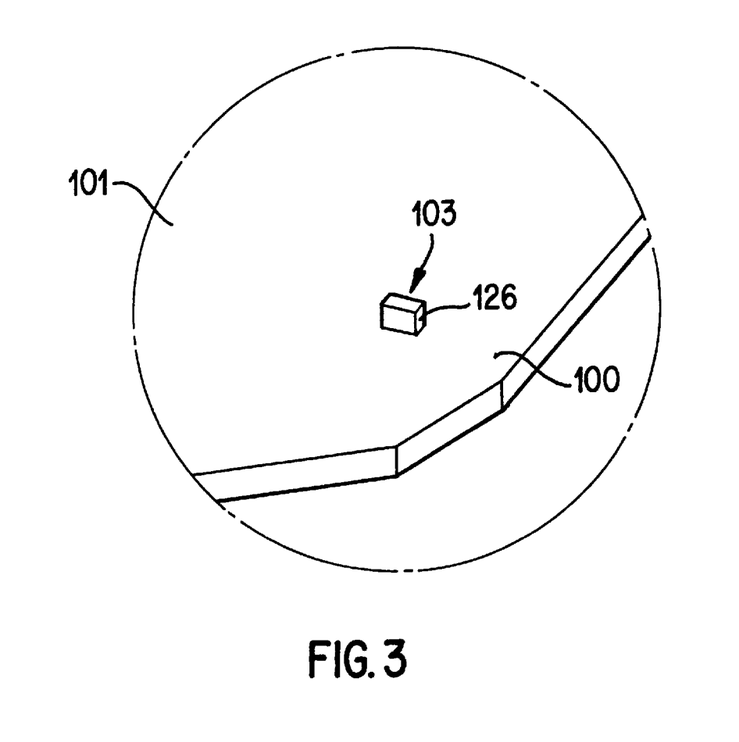
FIG. 3 is an enlarged detailed view of FIG. 1 showing one of the fixed pressure posts.
Figure 6:
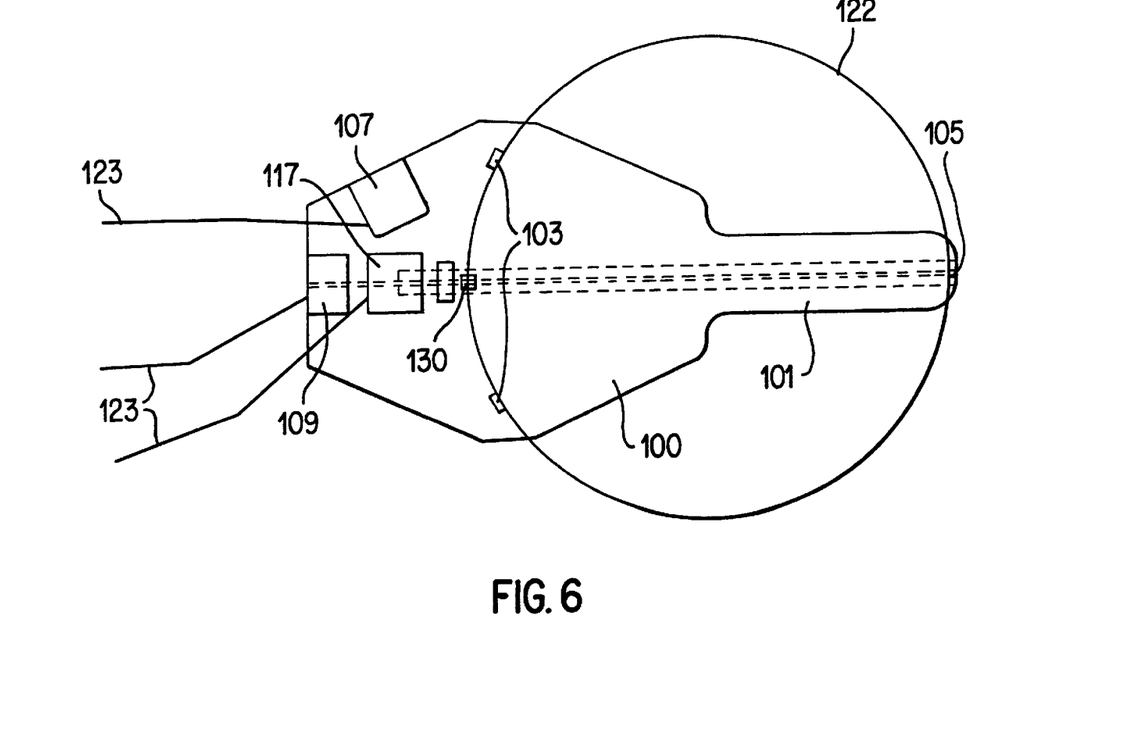
FIG. 6 is a top plan view of the embodiment of FIG. 5 showing a robotics wafer hand assembly according to an embodiment of the present invention with a wafer disposed thereupon the structure underlying the wafer also being shown.
Figure 7:
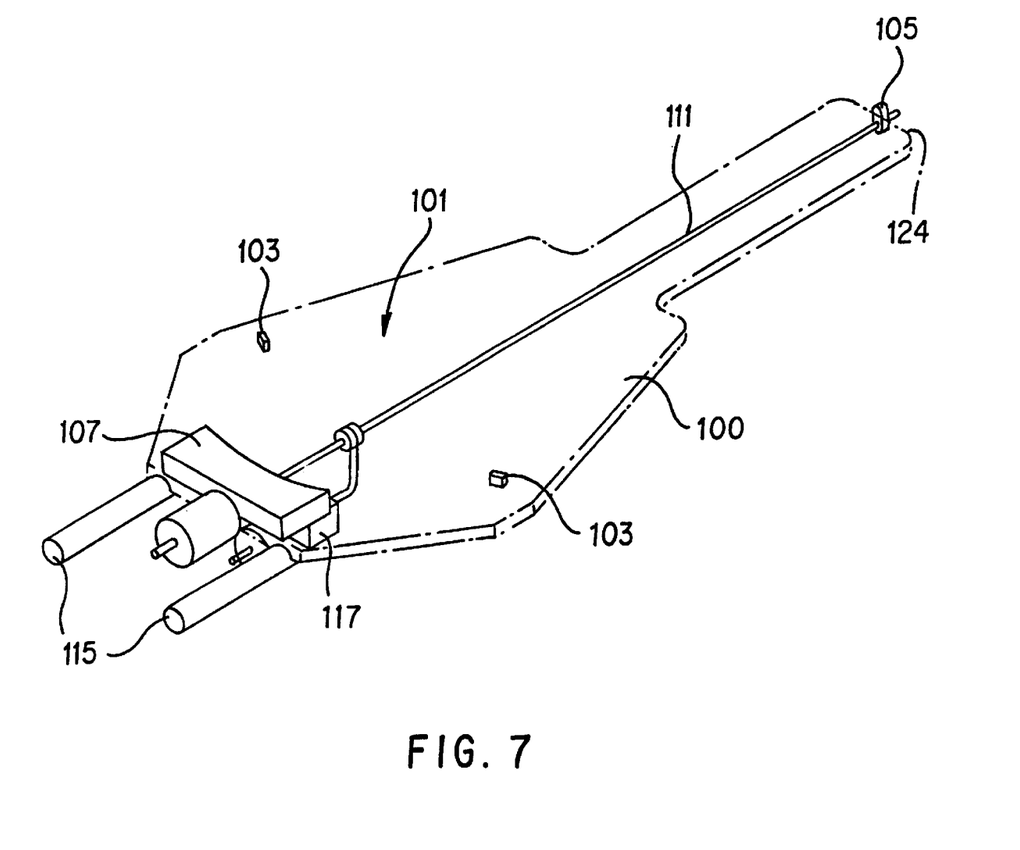
FIG. 7 is a schematic perspective top plan view of a robotics wafer hand assembly according to an embodiment of the present invention showing the cooperative interplay of each of the described and claimed elements above and below the paddle as if the paddle were transparent.

Referring now to FIGS. 2a, b, and c and FIG. 3, detailed views of a rotating finger 105 and of one of two fixed pressure posts 103 according to the embodiment of the present invention are shown. Wafer hand assembly 101 member has an actuating rod 111 disposed in a central portion thereof (see FIG. 7). When the assembly 101 is formed of two sheets of material, the actuating rod may be disposed in a channel between the two sheets of material so that it is not externally exposed. The wafer hand assembly 101 as shown in FIG. 2a, is slipped under a wafer 122, or between two wafers in a stack (FIG. 8) and rotating finger 105, is rotated 90° to the position shown in FIG. 2b. At this point the finger 105 is spaced from the wafer hand assembly 101 front edge 124. It is then moved toward the wafer hand assembly edge 124 as shown in FIG. 2c to grasp the wafer 122 between finger 105 and posts 103 as shown in FIG. 6.

Referring to FIGS. 1 and 4–7, a translator solenoid 117, through an arm 119, positions the finger 105 outwardly while a rotator solenoid 109, motor or similar translational and/or rotational device turns the finger 105 90°, presenting a lower profile whereby the wafer hand assembly 101 member can be inserted between wafers or rotated 180 degrees to pick up the wafer from the top. Once positioned under, over or between wafers 122, the finger 105 is rotated to the vertical position by the rotator solenoid 109 (see FIG. 2b) and then is pulled in by the translator solenoid 117 (see FIG. 2c).

Finger translator solenoid 117, finger rotating solenoid 109, and finger actuating rod 111, as discussed in detail below, cooperatively act for effective grasping and releasing of a wafer (or the like substrate member item to be held), and holding the same in a fixed position for transfer from one processing location to another, without breaking or dropping the wafer or bending it beyond acceptable limits. Likewise, a substrate member may be released and picked up at a position 180 degrees from its released position.

Finger actuating rod 111 is driven by the magnetic coil energized and controlled by finger translator solenoid 117 and finger rotator solenoid 109, as discussed in further detail below.

The wafer hand assembly 101 member has an actuating rod 111 disposed in a central portion thereof. Translator solenoid 117, through an arm 119 attached thereto, pushes the finger 105 in or out while rotator solenoid 109 turns finger 105 90°, presenting a lower profile whereby the wafer hand assembly 101 member can be inserted between wafer 122 or manipulated 180° to pick up the wafer 122 from the top or bottom. Once positioned under, over or alongside a wafer 122, the finger 105 is rotated to the vertical position (FIG. 2b) by the rotator solenoid 109 and then is pulled in (FIG. 2c) by the translator solenoid 117, locking the wafer 122 between the fixed posts 103 and the finger 105, as shown in FIG. 6.

Grasping action is accomplished by using finger 105 to pressure a wafer against fixed posts 103. This is very much like the natural grasping action of the human hand with the opposable thumb applying pressure on an object held against the fingers. Likewise, as mentioned above and treated in detail below, the analogy between wafer hand assembly 101 and the human arm includes the 180 degree rotation which would be characterized by, or controlled, like the action of a human wrist in changing the position of a human arm from one with a top side facing up to a top side facing down.

In the release mode, the finger 105 lies in the plane of the hand 101. Positioning of the finger 105 is accomplished through the controlling mechanics at the 'wrist' (or proximate) end of hand 101. In particular, a voice coil or motor/encoder combination is used to position finger 105.

Hand 101, while in the release mode, is positioned under the wafer selected through an optics system shown schematically at 117. At this point the finger 105 is rotated so as to present a surface to the wafer edge. The controlling mechanics then pulls the finger 105 towards the center of the wafer thereby pushing the wafer against the fixed diametrically opposed posts 103. Pressure is accurately maintained through precise control of the electrical current applied to the coil driving translator solenoid 117, which, in turn, causes the actuating rod 111 to move along the length of the hand 101. Leads 123 to the controls communicate information from a central processor (not shown) to the hand 101. It has been found that supplying a current of about 310 mA to about 360 mA to a solenoid supplied by a Model B LA13-12-00A exerts the appropriate grasping pressure on a 200 nmg (approx. 12") wafer held in the device.

Typically, finger movement as effected by finger translator solenoid 117 and finger rotating solenoid 105 is programmed on an application specific basis. Likewise the same can be accomplished by accurately controlling the current through voice coils and employing stops and cams where necessary. However, any of the mechanisms used in the field of motion control could be used when applicable. Once the wafer is grasped, the hand 101 can now transport the wafer to any location directed by the robotics. The exemplary feature of this grasping method is that it allows the hand to completely rotate the wafer through 360 degrees without dropping it. Permitting the wafer to be placed in a variety of carrier mechanisms. The ability to rotate as such will allow processing of both sides of the wafer. In addition, since the wafer is trapped between the posts 103 and finger 105, it can be moved at greater accelerations and speeds than possible with vacuum packs, thereby reducing processing time. As an added benefit, the wafer surface is not contaminated since only the edges come in contact with the hand. This will enhance production yields.

Referring to FIGS. 9 and 10 a further embodiment of the wafer handling assembly 201 includes a stiff member or paddle 200 with a single moveable post 203 centrally located at the control end 204 of the paddle 200 and two rotatable fingers 205 at the opposite end of the paddle, to form the three corners of a triangle for grasping a wafer 222 there between. Mounted to the wafer handling assembly 201 are two rotating coils 209, each connected to a finger 205, and a translational coil 217 for moving the post 203 a sufficient distance along the central axis 206 of the assembly 201 to grasp a wafer 222 with the desired tension between the post 203 and the fingers 205. As in the previously described embodiments the assembly 201 may also carry locating and positioning optics and related controls.

In contrast to the previous embodiment, in the embodiment of FIG. 9 and 10 the two spaced apart fingers 205 rotate from the plane of the paddle 200 as a result of a rotational force applied to actuating rod 211 to a position perpendicular to the paddle surface. However, they do not translate lengthwise. Instead, the single post 203 is moved along the central axis 206 of the paddle 200 to grasp the wafer, the tension on the wafer 222 being controlled by the current applied to the translational coil or solenoid 217, operating through the translational rod 218, which moves the post 203 to apply grasping pressure to the wafer 222. Otherwise, this embodiment operates in a similar manner to the previous described embodiment. The paddle 200 is positioned next to a wafer 222. The rotational solenoids 209, operating through actuating rod 211, causes the finger 205 to move into its perpendicular position with the wafer against the fingers 205. The translational solenoid 217

One skilled in the art based on the foregoing description will recognize that all of the supplemental features of the first described embodiment, including the optical sensing and positioning devices can be used on the further embodiment described above.

FIG. 11 is a wafer handling system 301 which is a modification of the embodiment of FIGS. 9 and 10 having the rotation of the fingers caused by a rotational force applied to a flexible actuating rod 311. As shown in FIG. 11, rather than the rod 311 being straight it is flexible and therefore capable of maintaining the same alignment from rotational solenoid 209 (not shown in FIG. 11) to the finger 205. Otherwise the modification of FIG. 11 operates in the same manner as the embodiment of FIG. 9.

Wafers are normally loaded in cassettes or caddies and are stacked in grooves that hold the wafer on the sides. The present system will locate the position of each wafer to a high degree of accuracy by employing light beams and photo sensors to detect the wafer edge. Changes in the reflections from the edge allows the optical sensing equipment to determine the wafer edge and, therefore, the position of the hand with respect to the wafer. The entire caddie can be scanned and all positions determined, including missing wafers, as a missing wafer will generate an anomaly in the spacing sequence.

Figure 4:
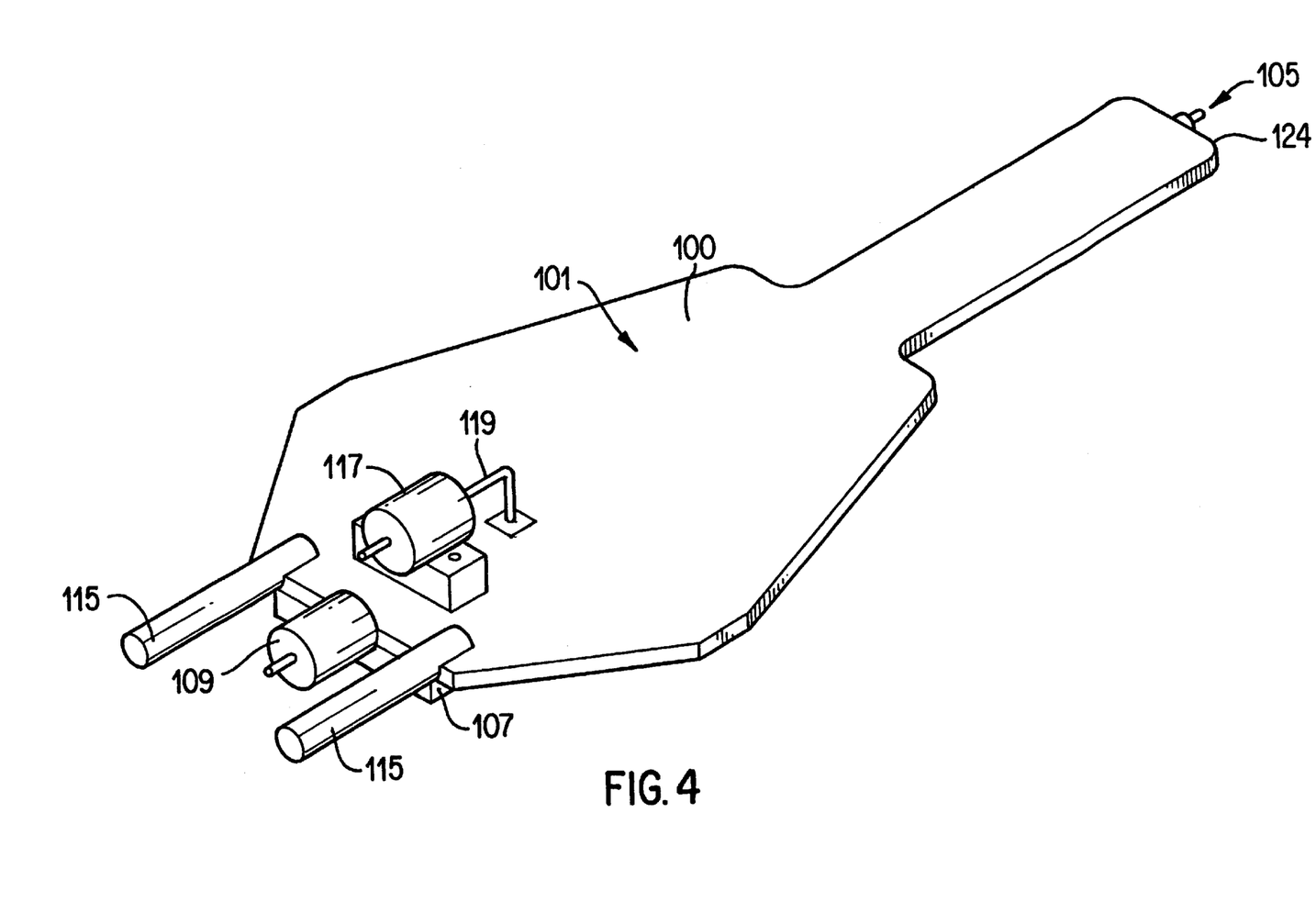
FIG. 4 is an additional perspective bottom plan view of a robotics wafer hand assembly according to an embodiment of the present invention as depicted in FIG. 1, showing a finger actuating rod, a finger translator solenoid and a finger rotating solenoid.
Figure 5:
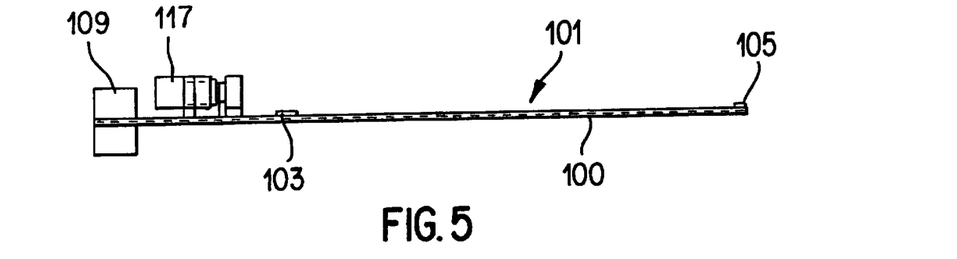
FIG. 5 is a side view of a modified version of the robotics wafer hand assembly according to an embodiment of the present invention with certain of the components relocated to the top of the assembly.

Sensing optics mount 107 is centrally mounted on the 'wrist' end of hand 101 as shown in FIGS. 1 and 4 or off to one side as shown in FIG. 6. The optics system in preferred embodiments is comprised of optical transmitters; e.g., lasers, IR diodes, etc.; optical receivers; e.g. photo diodes, CCD'S, photo transistors, etc., and the associated mechanical devices needed to direct an illuminating beam(s) at the edge of the wafer and receive the reflections. The beam(s) will be focused at an optimal distance from the finger end of the hand that will permit accurate and reliable position determination. The beam(s) can be modulated in intensity and position to reduce the effects of background noise and to enhance edge detection. More than one sensing optics mount 107 can be used, such as a second unit (not shown) at a similar location on the other edge of the face of the assembly to aid in positioning. Also, additional optical sensors 130 can be located on the hand 101 at various locations to aid in accurately measuring the size of wafer 122.

Panning the small focal point across the face of the edge will allow an accurate location of the edge vertices and consequently the wafer itself. Since the edge of the wafer represents a compound surface, reflections from the surface may or may not reach the receivers. Panning the beam(s) along the edge will increase the probability of detection and increase accuracy since the wafer radial line aligned along the long axis of the hand will produce the greatest reflection. This information will allow the robotics to generate the best hand alignment with reference to the wafer.

This system is driven by robotics of the form necessary to the application or process. Any of the digital/analog techniques used for determining position, speed, acceleration, and, in general, all parameters associated with displacement and motion may be used as applicable to the specific process. The system of the present invention further embodies the use of computer equipment in conjunction with process specific electromechanical, pneumatic, and hydraulic systems to attain the desired operation.

The control system which is contemplated as within the scope of the instant teachings likewise serves to direct and modulate the photo sources, position the photo detectors, analyze the data from the detectors representing the variations in reflections, use the processed data to direct the motion control units to position the equipment as desired, and to process the feedback data from the motion control units to determine correction signals.

Further mechanisms used in conjunction with this system generate any alarms, signals and/or bells required, and format and output required data as video, print, audio, telephony, telemetry or as any of the other communications technologies necessary.

Since the system of the present invention has a wide range of applications, material used in the fabrication of this system will necessarily be diverse. This is to include, but not be limited to, metals, plastics, ceramics, glass, wood and all the various alloys, grades, tempers, compounds, and varieties of such, including compounds and combinations. The specific application and environment will dictate the actual materials used.

As discussed, related improvements according to the teachings of the present invention include replacement of conventional teachings with dynamic automated system employing laser-measuring equipment. Likewise, it is contemplated by the present invention to replace existing 'vacuum chuck' technology with an electromechanical or gas actuated system that does not rely on a vacuum and provides a positive lift and retention system.

Modern laser distance measuring equipment is capable of making very precise measurements. Suitably locating one or more laser reading heads will provide all the information necessary to accurately locate and size each wafer in the processing system. Typically a laser head located as reference on a two-axis mount would sweep the column of wafers in a cassette.

The shown locations are not intended to limit the location or number of optical sensors. The reflection from the individual disks provide the line-of-sight distance from the reference. Further, a reading from the second optical sensor 130 located on the center line of the hand 101, when taken in conjunction with the known position of the posts 103, can be used to sense the exact location of the edge of a circular wafer disc and in turn determine the exact diameter of the disc for use in setting the current delivered to the tensioning solenoid.

Encoders in the axis mounts likewise are effective for supplying azimuth information, as is known to artisans.

From the combined information, sent to a central processor, the exact position of each wafer relative to the reference can be determined to a high degree of precision. This same process is applied to the destination locations of each wafer. The processor then utilizes the information to exactly place the wafers, as needed in cassettes or caddies.

Different metals and plastics are used according to the teachings of the present invention. The environment will determine this where the unit is used. Mechanical interface to the different types of robots will cause many different mechanical designs. This will in no way effect the smooth operation of the intelligent integrated wafer handling system.

To avoid bending or cracking of a wafer to be lifted, the amount of pressure applied by the moveable finger 105 must be controlled precisely. The embodiment of the present invention described above utilizes an actuator of the voice coil type to provide the required amount of hold on the disk. This is accomplished by closely controlling the current through the coil. Again, the correct parameters for a particular type of and size of wafer is entered into the central controller. This provides a highly accurate and repeatable method of lifting the wafers without breakage. In addition, since the wafers are 'trapped' within the two posts and finger, no movement can result because of high accelerations during the transportation of the wafer from one processing point to another.

Likewise, according to the instant teachings the system can also be implemented using hydraulics with a gas (e.g.; dry air or dry nitrogen) or liquid driven mechanism. The clinching finger motion can be controlled through a device such as a variable needle valve and associated valving, such as by varying the electric current fed to the valve driver or controlling the % opening of the valves.

Overall system control is through a main central processing unit (CPU) which contains the software that defines the actual operations performed. The CPU interfaces with various handling and processing mechanisms through specially designed interfaces optimized for the function required. The system as a whole is made up of individual sections representing the various processes. Each section is arranged so as to allow the handling system access.

Different environments will, naturally, dictate different arrangements of the various processing sections. This in turn would require different software. To meet the numerous changes in software likely to result, each processing section running as a subprogram in an overall controlling shell. The unique data required by each section is then be entered as 'calibration data' that is easily passed between the individual sections and the main shell. This allows total flexibility and ease of use since each section is running autonomously with respect to the others.

The system above utilizes individual wafer processing sections controlled by a central CPU. Since each section runs autonomously under overall supervision of the shell software, different system arrangements are allowed to meet the needs of the physical environment.

The foregoing is meant to illustrate, but not to limit, the scope of the invention. Indeed, those of ordinary skill in the art can readily envision and produce further embodiments, based on the teachings herein, without undue experimentation.

For example, while the various components of the system are shown mounted on one side of, or within, the assembly, the invention contemplates locating same on either side or extending off the robot arm end of the assembly.

Also, as indicated above, while the invention has been described in relationship to semiconductor wafers, it can be used to handle any flat, stiff sheet-like structures of defined dimensions, such as ceramic or glass dishes or plates, petric dishes containing growth media, compact disks in a CD player, removable storage media in a computer system or any other mechanical system which requires removal, transport or handling of disc like articles. Also, various techniques can be used to control the grasping pressure on the wafer. However, the tension is controlled by varying and setting the driving force to the finger 105 and/or post 203 and does not require measuring the force actually applied.

While the invention is described as having one or two rotating lengths and one or two fixed or moveable (translational) posts, other combinations, or additional posts and or fingers are contemplated.

The present invention may be embodied in other specific forms without departing from its essential characteristics. The described embodiment is to be considered in all respects only as illustrative and not as restrictive. The scope of the invention is, therefore, indicated by the appended claims rather than by the foregoing description. All changes which come within the meaning and range of the equivalence of the claims are to be embraced within their scope.

What is claimed is:

1. A system for handling wafers and the like substrate means, comprising, in combination:

a hand assembly;

a means for grasping, transporting and releasing said substrate means to be handled;

at least a control means for programming and implementing a desired sequence of operations, and grasping pressure control means dependent on the driving force fed to the means for grasping wherein said means for grasping, transporting and releasing said substrate means to be handled further comprise:

a pair of fixed posts each having a central axis substantially perpendicular to the hand assembly;

a rotating finger, means for positioning the axis of the rotating finger parallel to the axes of the fixed posts; and means to reversibly move the axis of the rotating finger toward the axes of the fixed posts said means for positioning the axis of the rotating finger parallel to the axes of the fixed posts comprising a finger translating solenoid or voice coil.

2. The system of claim 1 further including an optical means for detecting a local position and orientation of a substrate means to be handled.

3. The system of claim 1, said means for grasping, transporting and releasing said substrate means to be handled further comprising at least one of an electromechanical and a fluid actuated system for providing positive lift and retention.

4. The system of claim 1 wherein the grasping pressure control means is an electrically activated solenoid and the grasping pressure is controlled by varying the current fed to the solenoid.

5. The system of claim 1 further including measuring means for determining the dimensions of a wafer.

6. The system of claim 1, wherein said means to reversibly move the axis of the finger-like projection toward the axes of the fixed posts comprises a finger rotating solenoid and a finger actuating rod.

7. A method for handling wafers, and related compact planar devices without damaging their surface integrity, the method comprising the steps of:

providing a robotic wafer hand assembly equipped with at least three posts, the posts being positioned perpendicular to the plane of the wafer with at least one of said posts being rotational from a position in the plane of the wafer to a position perpendicular to the plane of the wafer and at least one of the posts being movable toward the one or more other posts to grasp a wafer there between, and optical sensing means, said robotic wafer hand assembly being mountable on other robotic systems for positioning;

gathering a plurality of data regarding the relative position and orientation of a plurality of wafers, the actuating rod being connected to the rotating finger;

grasping a wafer between the posts in a central portion of said robotic wafer;

locking the wafer between the fixed posts and the finger;

transporting the wafer to a desired location;

processing the wafer;

releasing said wafer into a second desired location; and repeating each of said steps for a subsequent wafer.

8. The method of claim 7, said grasping step further comprising the steps of:

moving said robotic wafer hand assembly parallel to the planar surface of a wafer; and moving at least one rotating finger disposed at a distal end thereof from a position in the plane of the wafer hand assembly to a position substantially perpendicular to the plane of the wafer hand assembly.

9. The method of claim 7, said locking step further comprising the steps of:

turning the finger 90° by way of a rotator solenoid; and positioning said robotic wafer hand assembly adjacent a planar surface of a wafer.

10. The method of claim 7, said locking step further comprising the step of moving at least one rotating finger toward the other posts which are fixed in position causing the wafer to be trapped between the posts fixed in position and the rotating finger with a predetermined tension applied to the wafer.

11. The method of claim 7, said locking step further comprising the step of moving one of the posts which is a translational post toward a point centrally located between the rotational posts causing the wafer to be trapped between the translational post and the rotating posts with a predetermined tension applied to the wafer.

12. The method of claim 7, said locking step further comprising the step of moving the rotating finger by way of the translator solenoid.

13. The method of claim 10 wherein the tension applied to the wafer is controlled by varying the current supplied to a rod movement actuator, said rod movement actuator controlling the lateral movement of the actuating rod attached to the rotating finger.

14. The method of claim 11 wherein the tension applied to the wafer is controlled by varying the current supplied to a rod movement actuator, said rod movement actuator controlling the lateral movement of the translational post toward the rotating fingers.

15. A system for handling wafers and the like substrate means, comprising, in combination:

a hand assembly, a means for grasping, transporting and releasing said substrate means to be handled, at least a control means for implementing a desired sequence of operations, and grasping pressure control means dependent on the driving force fed to the means for grasping, said means for grasping comprising three posts mounted on the hand assembly, at least one of the posts being moveable from a position in the plane of the hand assembly to a position perpendicular to the plane of the hand assembly the remaining posts being fixed in an orientation perpendicular to the plane of the hand assembly at least one movable post being moveable translationally toward the other posts along the plane of the hand assembly, the at least one rotational post and at least one translational post being either the same post or a different post.

* * * * *